(12) United States Patent
Grzeskowiak et al.

(10) Patent No.: US 11,201,051 B2
(45) Date of Patent: Dec. 14, 2021

(54) METHOD FOR LAYER BY LAYER GROWTH OF CONFORMAL FILMS

(71) Applicant: Tokyo Electron Limited, Tokyo (JP)

(72) Inventors: Jodi Grzeskowiak, Cuddebackville, NY (US); Anton J. Devilliers, Clifton Park, NY (US); Daniel Fulford, Cohoes, NY (US)

(73) Assignee: Tokyo Electron Limited, Tokyo (JP)

( * ) Notice: Subject to any disclaimer, the term of this patent is extended or adjusted under 35 U.S.C. 154(b) by 218 days.

(21) Appl. No.: 16/679,594

(22) Filed: Nov. 11, 2019

(65) Prior Publication Data

US 2020/0152448 A1    May 14, 2020

Related U.S. Application Data

(60) Provisional application No. 62/760,607, filed on Nov. 13, 2018.

(51) Int. Cl.
  *H01L 21/02*    (2006.01)
  *C09D 179/08*   (2006.01)
  (Continued)

(52) U.S. Cl.
  CPC ...... *H01L 21/02118* (2013.01); *C09D 179/08* (2013.01); *G03F 7/20* (2013.01); *G03F 7/30* (2013.01); *H01L 21/76831* (2013.01)

(58) Field of Classification Search
  CPC ......... H01L 21/02118; H01L 21/76831; H01L 21/02304; H01L 21/0228; H01L 21/76898;
  (Continued)

(56) References Cited

U.S. PATENT DOCUMENTS 8,822,133 B2    9/2014    Trefonas, III et al.
8,956,808 B2    2/2015    Schmid et al.
(Continued)

FOREIGN PATENT DOCUMENTS

JP    2014-185318 A    10/2014
KR    10-2017-0006341 A    1/2017

OTHER PUBLICATIONS

International Search Report and Written Opinion dated Mar. 4, 2020 in PCT/US2019/060878, 9 pages.

*Primary Examiner* — Caleen O Sullivan
(74) *Attorney, Agent, or Firm* — Oblon, McClelland, Maier & Neustadt, L.L.P.

(57) ABSTRACT

Techniques herein include methods of forming conformal films on substrates including semiconductor wafers. Conventional film forming techniques can be slow and expensive. Methods herein include depositing a self-assembled monolayer (SAM) film over the substrate. The SAM film can include an acid generator configured to generate acid in response to a predetermined stimulus. A polymer film is deposited over the SAM film. The polymer film is soluble to a predetermined developer and configured to change solubility in response to exposure to the acid. The acid generator is stimulated and generates acid. The acid is diffused into the polymer film. The polymer film is developed with the predetermined developer to remove portions of the polymer film that are not protected from the predetermined developer. These process steps can be repeated a desired number of times to grow an aggregate film layer by layer.

20 Claims, 7 Drawing Sheets

(51) Int. Cl.
*G03F 7/30* (2006.01)
*G03F 7/20* (2006.01)
*H01L 21/768* (2006.01)

(58) Field of Classification Search
CPC . C09D 179/08; G03F 7/20; G03F 7/30; G03F 7/165; G03F 7/405; C08G 73/1071
USPC ........................................................ 430/325
See application file for complete search history.

(56) References Cited

U.S. PATENT DOCUMENTS

| | | |
|---|---|---|
| 8,980,538 B2 | 3/2015 | Somervell et al. |
| 10,191,371 B2 | 1/2019 | Trefonas, III et al. |
| 10,353,290 B2 | 7/2019 | Park et al. |
| 2011/0111339 A1* | 5/2011 | Cheng .................... G03F 7/095 430/270.1 |
| 2012/0088192 A1 | 4/2012 | Trefonas, III et al. |
| 2014/0154630 A1 | 6/2014 | Schmid et al. |
| 2014/0272723 A1 | 9/2014 | Somervell et al. |
| 2014/0335454 A1 | 11/2014 | Trefonas, III et al. |
| 2015/0322219 A1* | 11/2015 | Someya ............... C09D 201/00 428/195.1 |
| 2017/0010531 A1 | 1/2017 | Park et al. |

* cited by examiner

Figure 4 – Using a SAM to initiate conformal coating.

FIG. 7

METHOD FOR LAYER BY LAYER GROWTH OF CONFORMAL FILMS

INCORPORATION BY REFERENCE

This present disclosure claims the benefit of U.S. Provisional Application No. 62/760,607, filed on Nov. 13, 2018, which is incorporated herein by reference in its entirety.

FIELD OF THE INVENTION

The present disclosure relates to a method of depositing materials on wafers for processing and microfabrication of semiconductors.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Conformal coatings provide a film that follows a topography of a substrate with generally a uniform thickness on all surfaces. Conventional conformal coatings are deposited via atomic layer deposition (ALD) or chemical vapor deposition (CVD). ALD and CVD, however, can be slow and expensive—especially when relatively thicker films are desired.

Conformal coatings are desired for many applications in microfabrication. Some of these applications include multi-color (multi-material) patterning and liners for through silicon via (TSV) interconnects. Layer-by-layer growth of conformal films of varying composition can be achieved using coater-develop systems. Such techniques are faster layer-by-layer grown compared to ALD. Moreover, relatively thick films (one to several microns) are used for some applications, and techniques are desired that provide a sufficiently fast growth rate to accommodate desired throughput.

SUMMARY

The present disclosure relates to a method of processing a substrate, including: providing a substrate; depositing a first film of a self-assembled monolayer (SAM) over the substrate, the first film of the SAM including an acid generator configured to generate acid in response to a predetermined stimulus; depositing a first film of a polymer over the first film of the SAM, the first film of the polymer being soluble to a predetermined developer and configured to change solubility in response to exposure to the acid; stimulating the acid generator; diffusing the acid from the acid generator into the first film of the polymer; and developing the first film of the polymer with the predetermined developer to remove portions of the first film of the polymer that are not protected from the predetermined developer.

The disclosure additionally relates to a method of processing a substrate, including: providing a substrate; depositing a first film of a self-assembled monolayer (SAM) over the substrate, a structure of the SAM including a head group, a tail, and a functional group, the tail connecting the head group to the functional group, the head group attaching to a surface of the substrate, the functional group including an amine functional group; depositing a first film of a dianhydride on the first film of the SAM, the first film of the dianhydride including dianhydride molecules; reacting the amine functional group with anhydride ends of the dianhydride molecules to form imide bonds; and removing remaining dianhydride molecules from the substrate that did not react with the amine functional group.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein include methods for growing films via a layer-by-layer flow. There are multiple methods herein for enabling such film growth. In one embodiment, a method includes an acid diffusion facilitated process. In one embodiment, a method includes an imide chemistry-based technique. Each method includes using a self-assembled monolayer (SAM) film to anchor to a substrate and initiate film conformity.

Figure 1A:
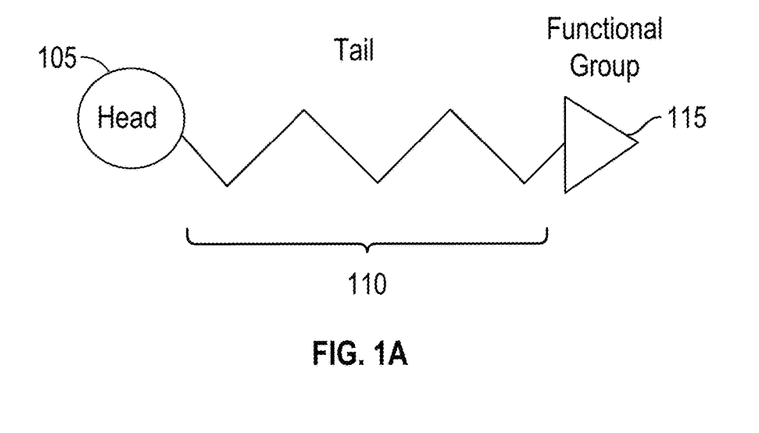
FIG. 1A is a schematic diagram illustrating the basic structure of a SAM molecule, according to an embodiment of the present disclosure.
Figure 1B:
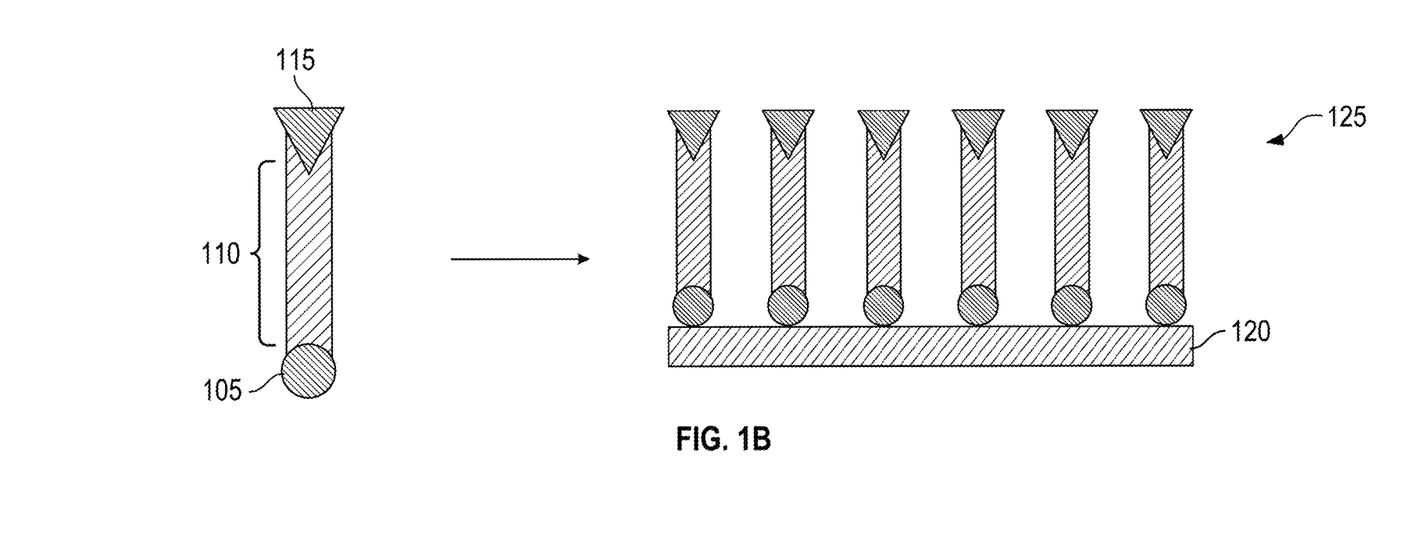
FIG. 1B is a schematic diagram that shows how a SAM molecule can attach to a substrate, according to an embodiment of the present disclosure.

FIG. 1A illustrates the basic structure of a molecule for use in a SAM 125, according to an embodiment of the present disclosure. FIG. 1B shows how the SAM 125 molecule can attach to a substrate 120, according to an embodiment of the present disclosure. A material of the substrate 120 can be, for example, silicon, glass, indium tin oxide, quartz, etc. In an embodiment, the substrate 120 can include structures provided thereon. The SAM 125 molecule can include three general sections: a head group 105, a tail 110, and a functional group 115. The head group 105 can participate in attachment chemistry with the substrate 120. The tail 110 can connect the head group 105 and the functional group 115. The functional group 115 can generate acid, link to other molecules, be photoactive, or change the surface energy of the substrate. In an embodiment, as the head group 105 attaches to a surface of the substrate 120, the functional group 115 can be positioned away from the substrate 120 and form a layer ready for contact with subsequent materials.

In one example, the functional group 115 can be a thermal acid generator (TAG) configured to generate acid in response to heat. In another example, the functional group 115 can be a photo acid generator (PAG) configured to generate acid in response to receiving radiation of a predetermined wavelength of light. The TAG, PAG, or other acid generator can be selected to cause a de-protection reaction or crosslinking reaction to occur in a predetermined polymer, wherein the predetermined polymer can be coated overtop the SAM 125. This de-protection reaction or crosslinking reaction within the predetermined polymer can result in a solubility switch of the predetermined polymer. That is, diffusing acid from the functional group 115 into the predetermined polymer can form a polymer film that conformally follows the SAM 125.

Figure 2A:
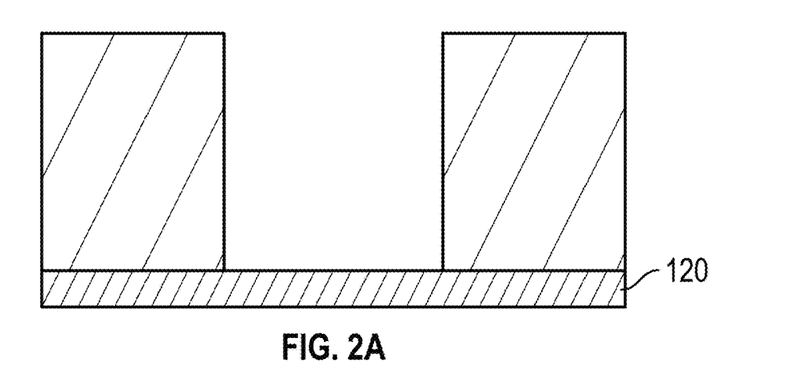
FIG. 2A is a cross-sectional substrate segment illustrating structures disposed on a surface of the substrate forming a trench, according to an embodiment of the present disclosure.
Figure 2B:
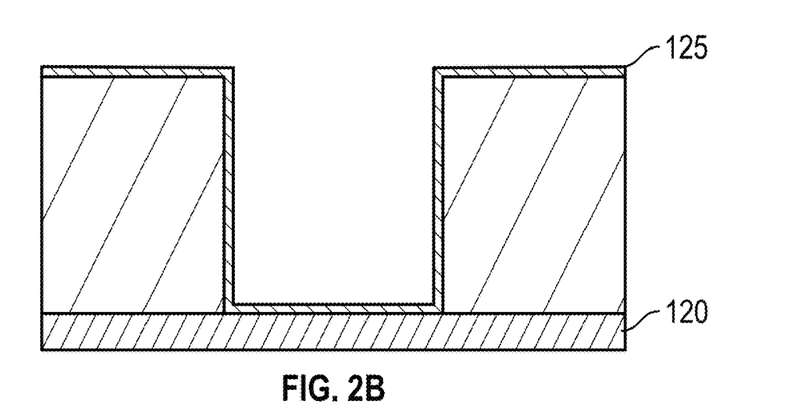
FIG. 2B is a cross-sectional substrate segment illustrating a first film of a SAM grafted to a substrate, according to an embodiment of the present disclosure.
Figure 2C:
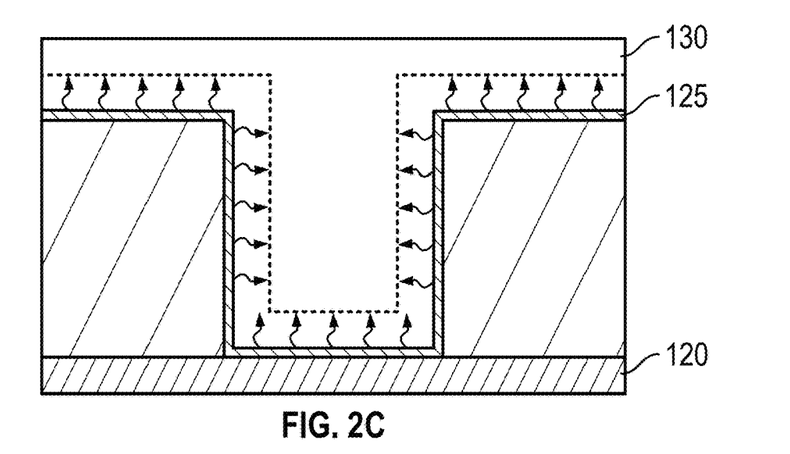
FIG. 2C is a cross-sectional substrate segment illustrating a first film of a polymer coated overtop a first film of the SAM, according to an embodiment of the present disclosure.
Figure 2D:
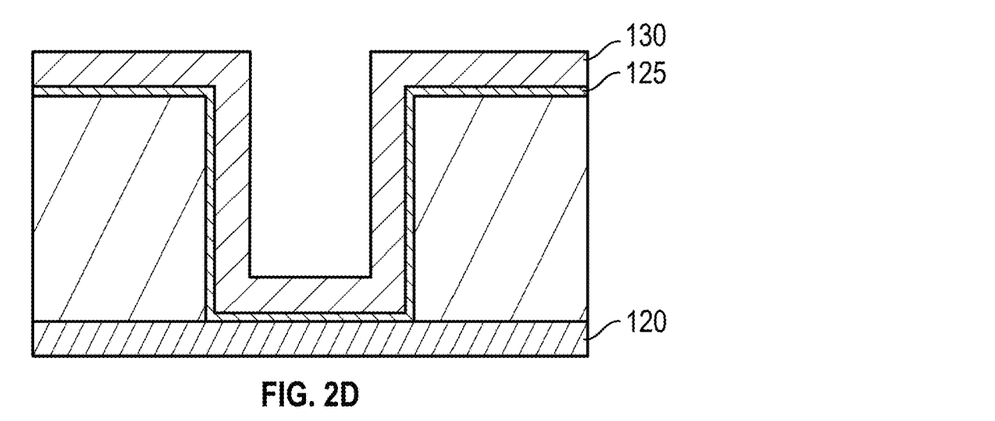
FIG. 2D is a cross-sectional substrate segment illustrating a polymer after being developed to remove any unreacted polymer, according to an embodiment of the present disclosure.

FIGS. 2A-2F show acid diffusion-based film growth, according to an embodiment of the present disclosure. FIG. 2A shows the substrate 120 with structures disposed on the surface of the substrate 120 forming a trench, according to an embodiment of the present disclosure. FIG. 2B shows a first film of the SAM 125 grafted to the substrate 120, according to an embodiment of the present disclosure. FIG. 2C shows a first film of a polymer 130 coated overtop the first film of the SAM 125, according to an embodiment of the present disclosure. The substrate 120 can be exposed to heat to cause the SAM 125 to generate the acid and drive diffusion of the acid into the polymer 130. Acid can diffuse an equal distance from the SAM 125, which can create an insoluble portion of the polymer 130 that conformally follows the SAM 125. FIG. 2D shows the polymer 130 after being developed to remove any unreacted polymer 130, according to an embodiment of the present disclosure. Developing the polymer 130 after the acid creates the insoluble portion can yield a conformal film of the polymer 130 on the conformally deposited SAM 125. For example, a predetermined developer can dissolve and remove remaining soluble polymer 130.

Figure 2E:
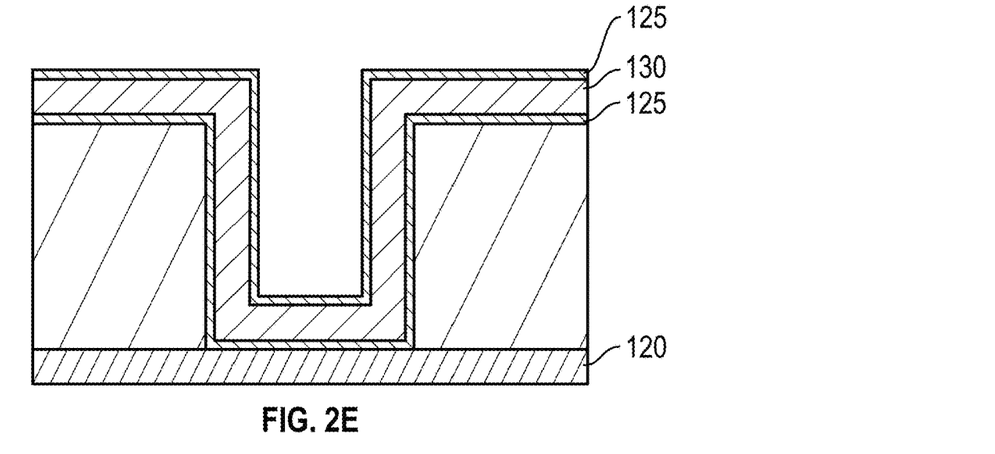
FIG. 2E is a cross-sectional substrate segment illustrating a second film of a SAM conformally deposited on a first film of polymer, according to an embodiment of the present disclosure.
Figure 2F:
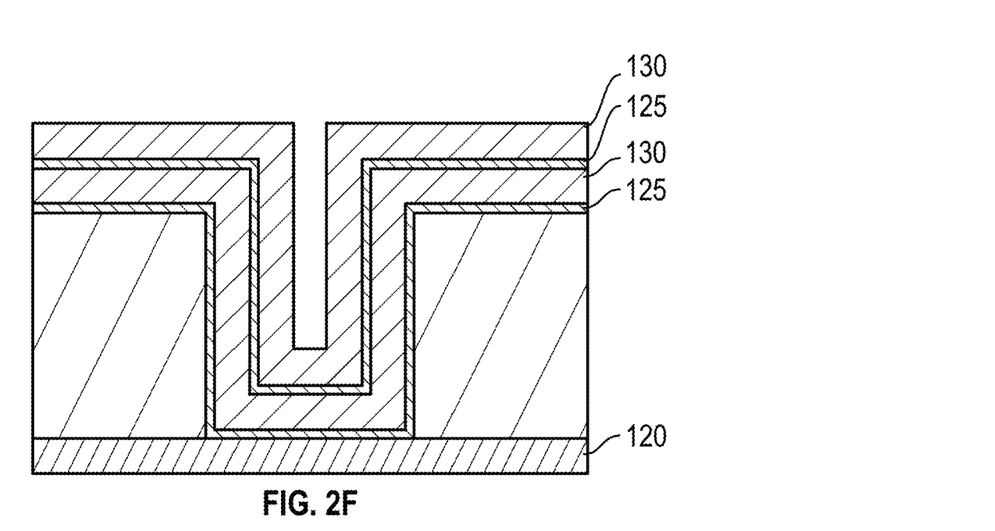
FIG. 2F is a cross-sectional substrate segment illustrating a second film of a polymer formed overtop a second film of SAM, according to an embodiment of the present disclosure.

In an embodiment, the process can be repeated to yield additional layers of the SAM 125 and polymer 130 conformally coated on the substrate 120 and structures. FIG. 2E shows a second film of the SAM 125 conformally deposited on the first film of the polymer 130, according to an embodiment of the present disclosure. The second film of the SAM 125 can similarly be a single layer of the SAM 125 molecule that follows the topography of the layer surface below. FIG. 2F shows a second film of the polymer 130 formed overtop the second film of the SAM 125, according to an embodiment of the present disclosure. This can be formed similarly to the first layer of the polymer 130, wherein the polymer 130 can be coated over the second film of the SAM 125, exposed to heat to cause the second film of the SAM 125 to generate the acid, drive diffusion of the acid into the polymer 130, and create the insoluble portion of the second film of the polymer 130, and developed to remove soluble portions of the second film of the polymer 130. Having duplicate sets of the SAM 125 and the polymer 130 can, for example, lead to thin film interference effects based on a refractive index and a thickness of the SAM 125 and the polymer 130 (e.g. a Bragg reflector structure).

Advantageously, the thickness of (the insoluble portion of) the polymer 130 can be varied based on myriad factors including, for example, a molecular weight of the acid, a bake time, a bake temperature, and a diffusion length of the acid (distance traveled by the acid). Accordingly, polymers for use with techniques herein can be selected based on their molecular weight to result in films of various predetermined thicknesses, which can also be modified or controlled by the bake time and temperature. This process of coating the SAM 125 followed by coating the polymer 130, acid diffusion, and development can be repeated multiple times to achieve the desired film thickness. Moreover, each repetition can have different film thicknesses. For example, a first polymer film can be baked for a short bake time to yield a thinner polymer 130 film, while a second polymer film can be baked for a long bake time to yield a thicker polymer 130 film. For example, the polymer In an embodiment, the polymer 130 may be different for each layer of the polymer 130 based on a desired stacking structure.

Figure 3:
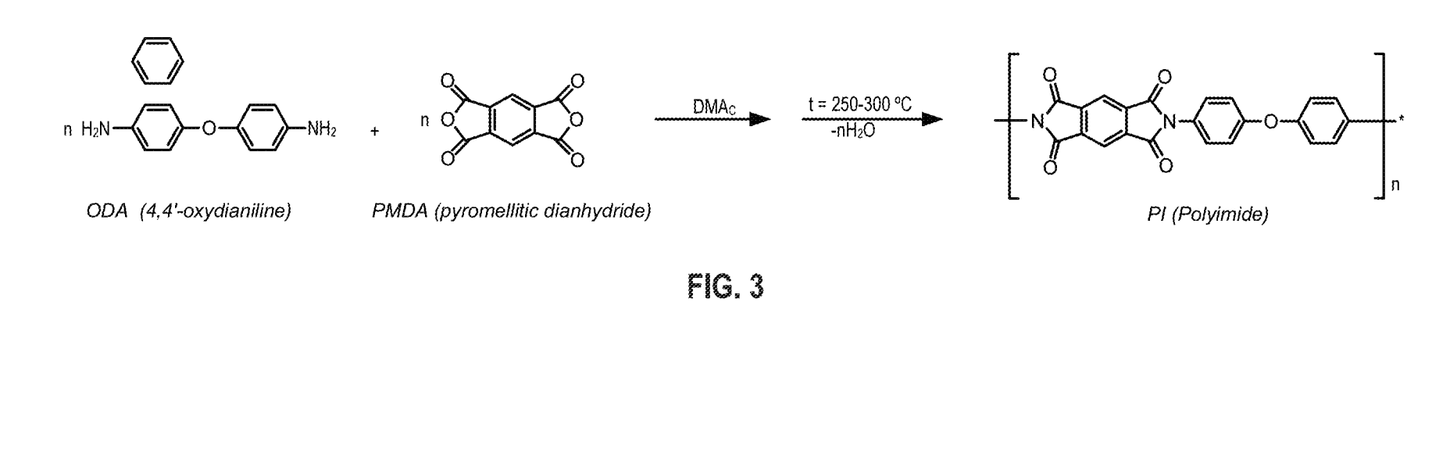
FIG. 3 is a structural formula showing a polyimide reaction, according to an embodiment of the present disclosure.

While polyimide films can be grown via a chemical vapor deposition (CVD) process, poor conformity of the film in deep trenches can result. In other embodiments, a different functional group 115 can be used with the SAM 125. For example, the functional group 115 can be selected to participate in direct bond formation with other molecules to build a film, similar to a click chemistry process. FIG. 3 shows a polyimide reaction, according to an embodiment of the present disclosure. For example, the polyimide reaction can use an amine and an anhydride reacted together to form an imide bond. Polyimide films can be grown for through silicon via (TSV) liner applications.

Figure 4:
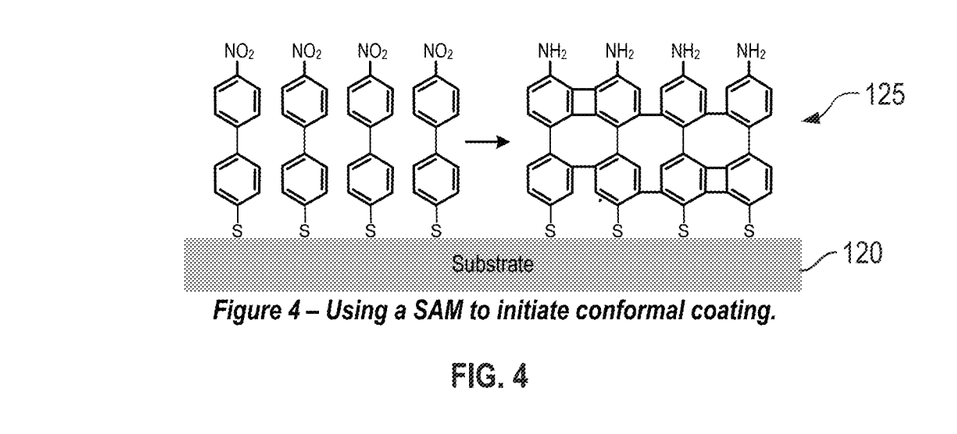
FIG. 4 is a schematic diagram that shows an example SAM with a selected functional group, according to an embodiment of the present disclosure.

Techniques herein can leverage formation of the SAM 125 to anchor a reaction chemistry to a surface, thereby controlling conformity. FIG. 4 shows an example SAM 125 with a selected functional group 115 (amine), according to an embodiment of the present disclosure. The SAM 125 with an amine group can be initially deposited on the substrate 120. Alternatively, the amine group can be created after deposition of the SAM 125. For example, the SAM 125 can be deposited that initially has a nitro group as the functional group 115. The nitro group is then cross-linked and converted to an amine group upon exposure to actinic radiation, such as exposure to EUV radiation or a high energy electron beam. Alternatively, the nitro group can be converted to an amine group by chemical reaction to a spin-on material or vapor-phase exposure. Such conversion can increase thermal stability of the SAM 125 film which can be useful for microfabrication processes.

Figure 5:
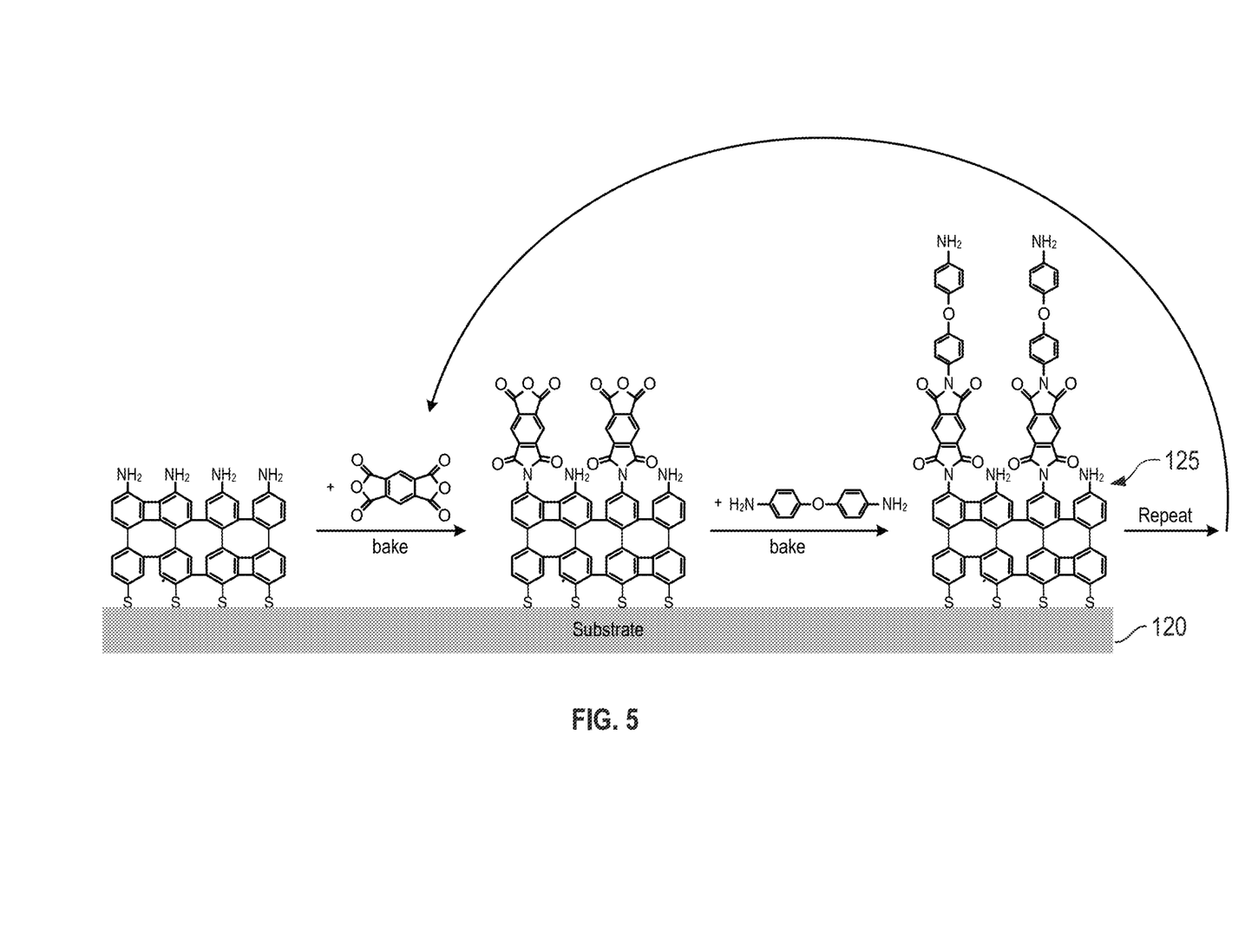
FIG. 5 is a schematic diagram that shows repeated growth of a polyimide film layer-by-layer, according to an embodiment of the present disclosure.

After the SAM 125 with an amine functional group 115 is conformally formed on the substrate 120, subsequent film layers can be formed. A dianhydride can be coated overtop the SAM 125. One of the anhydride ends of the dianhydride molecule can react with the amine group on the SAM 125 to form an imide bond. The reaction can be initiated by heating the SAM 125 and dianhydride. This can be followed with a coating of the diamine, which would react in a similar fashion and form a bond with the unreacted anhydride to form another imide bond upon heating. Repeating this process cyclically would produce the polyimide film. The growth rate of this process can be tuned through modification of the dianhydride and diamine molecular lengths. This film results in a conformal film as the previous embodiment. FIG. 5 shows how this process can be continued to grow the polyimide film layer-by-layer, according to an embodiment of the present disclosure. Note that conformal film thickness growth with this embodiment is limited by length of molecules used. Using a coater-developer tool to build such polyimide films can provide significant throughput improvement as compared to iCVD (initiated CVD) deposition methods.

Examples of chemistry families for the head group 105, the tail 110, and the functional group 115 are described as follows. Chemistry families for the head group 105 can include: —SH (thiol), —SR (sulfide), —SO3H (sulfonic acid), —OH (alcohol), —COOH (carboxylic acid), —SiCl3 (silane), —Si(OR)3, —PO3H2 (phosphonicacid), —CONH2 (amide), —NH2 (amine), and —CN (nitrile). Chemistry families for the tail 110 can include: —(CH2)- (aliphatic), —(CF2) (fluorocarbon), —(C6H4) (aromatic), —(OCH2CH2O)— (epoxy polymer), or any combination thereof. Chemistry families for the functional group 115 can include: terminating body (—CH3, —CF3, —C6H5, etc.), PAG (similar to polymer bound PAGs, both ionic or non-ionic), TAG (non-ionic such as —CH2-O-SO2-C6H4-CF3 or ionic), or another reactive groups such as the examples for the head group.

Figure 6:
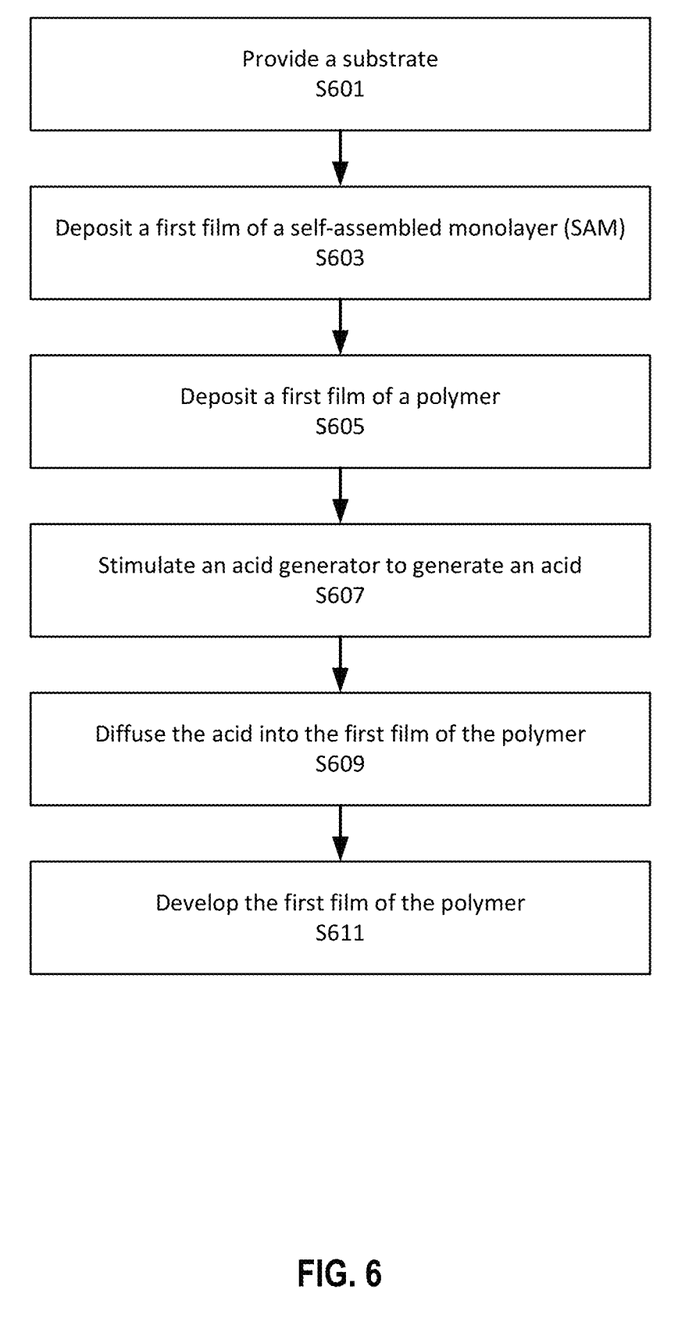
FIG. 6 is a flow chart showing a method for processing a substrate, according to an embodiment of the present disclosure.

FIG. 6 shows a method for processing a substrate, according to an embodiment of the present disclosure. In step S601, the substrate 120 is provided. In step S603, the first film of a SAM 125 is deposited on the substrate 120, the first film of the SAM 125 including the acid generator configured to generate the acid in response to the predetermined stimulus. In step S605, the first film of the polymer 130 is deposited overtop the first film of the SAM 125. In step S607, the acid generator is stimulated to generate the acid. In step S609, the acid is diffused into the first film of the polymer 130 from the first film of the SAM 125. In step S611, the first film of the polymer 130 is developed using the predetermined developer to remove soluble portions of the first film of the polymer 130.

Figure 7:
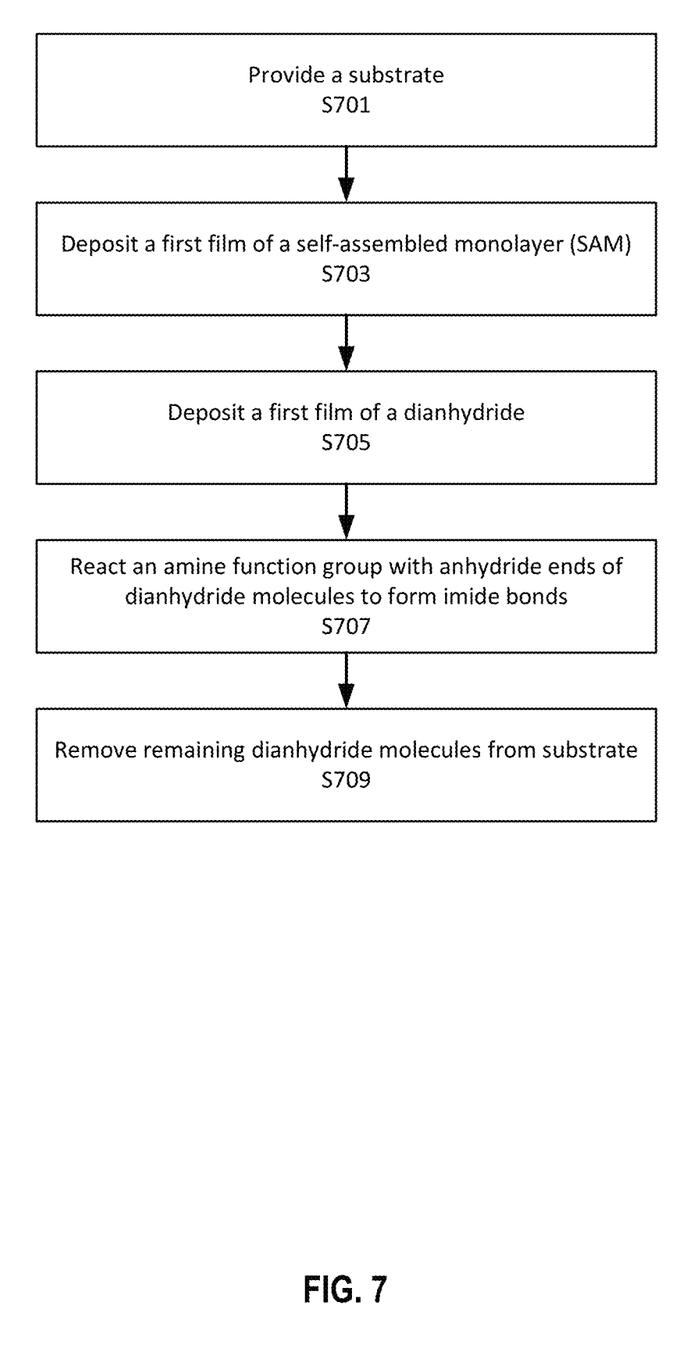
FIG. 7 is a flow chart showing a method for processing a substrate with a dianhydride, according to an embodiment of the present disclosure.

FIG. 7 shows a method for processing a substrate, according to an embodiment of the present disclosure. In step S701, the substrate 120 is provided. In step S703, the first film of the SAM 125 is deposited, the structure of the SAM 125 including the head group 105, the tail 110, and the functional group 115, the tail 110 connecting the head group 105 to the functional group 115, the head group 105 attaching to the surface of the substrate 120, the functional group 115 including the amine functional group. In step S705, the first film of the dianhydride is deposited overtop the first film of the SAM 125, the first film of the dianhydride including the dianhydride molecules. In step S707, the amine functional group is reacted with anhydride ends of the dianhydride molecules to form imide bonds. In step S709, the remaining dianhydride molecules from the substrate that did not react with the amine functional group are removed.

Techniques herein can also include area-selective film formation. For example, direct-write projection can be used for spatially targeted heating of the SAM 125 including a TAG. This can provide spatially variable exposure intensity. More specifically, infrared radiation can be directed at specific areas or points on the substrate to created localized heating, which creates insolubility at these specific areas. When rinsing and/or developing the substrate, areas that did not receive localized heating failed to create bonds and the polymer 130 or dianhydride in these areas can be removed from the substrate 120. In another example, direct-write projection can be used for spatially targeted radiation exposure of the SAM 125 including a PAG. More specifically, X-ray, extreme ultraviolet (EUV), or visible-light radiation can be directed at specific areas or points on the substrate to created localized photo-activation of the PAG, which creates insolubility at these specific areas. When rinsing and/or developing the substrate, areas that did not receive localized radiation failed to create bonds and the polymer 130 or dianhydride in these areas can be removed from the substrate 120.

One embodiment includes a method of processing the substrate 120. The substrate 120 can be received in a processing module configured to deposit liquids on the surface of the substrate 120. The processing module can be a coater-developer module of a track tool, or cleaning module, etc. The processing module can be configured to perform the SAM 125 deposition, the polymer 130 deposition, the acid generation and diffusion, and the development of the polymer 130 entirely along a single track without removing the substrate 120 from the processing module, including cleaning the resulting films and determining film conformity via metrology and other post-processing steps. The substrate 120 can include structures having a non-planar topography. For example, the substrate 120 can be a semiconductor wafer with devices formed thereon or a mask pattern formed thereon, or other topography of trenches, lines, via, etc.

The SAM 125 can be deposited on the substrate 120. The first film of the SAM 125 can be formed on the substrate 120. The first film of the SAM 125 can include the head group 105 attached to the surface of the substrate 120, the tail 110 connected to the head group 105, and the functional group 115 connected to the tail 110. Thus, the first film of the SAM 125 can attach to the substrate 120 in an orientation that is normal the surface of the substrate 120 with the functional group 115 away from the surface of the substrate 120. The functional group 115 can include an acid-generator compound, such as the TAG or the PAG. The first film of the SAM 125 can be deposited by either liquid phase or vapor phase deposition. Liquid phase deposition can be performed by, for example, a spin coater track, and vapor phase deposited can be performed in, for example, a vacuum chamber or atmospheric chamber (similar to hexamethyldisilazane (HMDS) deposition).

The first film of the polymer 130 can be deposited on the substrate 120. The first film of the polymer 130 can be non-conformal and soluble to the predetermined developer. For example, the first film of the polymer 130 can be deposited by spin-on deposition. The polymer 130 can fill trenches between the structures on the substrate 120 and form a substantially planar surface. Any of various polymers 130 can be selected that are compatible with a given acid-generator compound used.

With the first film of the polymer 130 deposited, acid can be generated from the acid-generator compound and diffused to an acid-diffusion length into the polymer 130. The acid-diffusion length defines an acid-diffused region of the first film of the polymer 130. Acid can diffuse normal to surfaces of the first film of the SAM 125. Diffused acid causes the acid-diffused region to become insoluble to the predetermined developer. The acid-diffusion length can determine how far acid travels from the surface of the SAM 125 (functional group 115) into the polymer 130. Note that depending on materials selected, the diffused acid can cause either a de-protection reaction or a cross-linking reaction to occur within the first film of the polymer 130. Accordingly, a negative tone developer or positive tone developer can be used for removing soluble portions of the polymer 130.

The first polymer layer is developed (after acid diffusion) with the predetermined solvent to remove soluble portions of the first polymer layer resulting in a second conformal film. With acid being diffused more or less perpendicular to the SAM 125 interface between the SAM 125 and the polymer, the acid diffusion region becomes a conformal film following the topography of the SAM 125.

These steps of depositing the SAM 125, depositing the polymer 130, diffusing acid to insolubilize portions of the polymer 130, and developing soluble portions of the polymer 130 can all be repeated one or multiple times until a film of a desired thickness is achieved. Such a film is a combined or layered film of alternating layers of the SAM 125 and the polymer 130. Depending on materials selected, as well as bake times, a one micron thick film (aggregate thickness of alternating layers) can be formed after 4-5 layer pairs (of the SAM 125 and the polymer 130). Advantageously, compared to the long depositions times of CVD, this process can be completed in less than approximately 10-20 minutes depending on a particular track tool configured for use. A given layer pair can have a conformal thickness up to, for example, 500 nm, depending on a particular polymer 130 used. In some embodiments, a shorter bake time can be selected for shorter diffusion lengths and a correspondingly smoother conformal surface.

In other embodiments, a photo-acid generator can be used. After deposition of the polymer 130, radiation can be used to generate the acid, and then a bake step can be used to drive the diffusion of the acid into the polymer 130.

Another embodiment includes a method of processing the substrate 120. The substrate 120 can be received in the processing module configured to deposit liquids on the surface of the substrate. The first film of the SAM 125 can be deposited on the substrate 120. The first film of the SAM 125 can be a conformal film on the substrate 120. The first film of the SAM 125 can include the head group 105 attached to the surface of the substrate 120, the tail 110 connected to the head group 105, and the functional group 115 connected to the tail 110. For example, the functional group 115 can include an amine as the functional group 115. A first dianhydride layer is deposited on the substrate 120, such as by spin-on deposition of liquid material. The first dianhydride layer is non-conformal and comprises dianhydride molecules. The amine functional group 115 is reacted with anhydride ends of the dianhydride molecules sufficient to form imide bonds. The reaction can be initiated by heating the substrate 120. Remaining dianhydride molecules can be removed from the substrate 120 that did not react with the amine functional group 115, resulting in a second conformal film overtop the SAM 125.

The steps of depositing the SAM 125, depositing the dianhydride layer, reacting anhydride ends with the amine functional group 115, and removing remaining dianhydride molecules can all be repeated to build layers of a polyimide film. The process can be repeated until reaching a desired thickness.

Film growth methods herein can be defined by an initial bond from the SAM 125 to the substrate 120 and solvent compatibility of the layers (e.g. the SAM 125, the polymer 130, etc.) to subsequent coatings. When using a TAG, growth rate can be tuned through acid molecular weight adjustment, polymer composition modification, and bake time and temperature optimization. When using a PAG, growth rate can be tuned through radiation wavelength, acid molecular weight adjustment, polymer composition modification, and bake time and temperature optimization. For polyimide film formation, a growth rate can be adjusted through molecular lengths of the dianhydride and diamine species. Both techniques can be executed without using CVD or atomic layer deposition (ALD), which can include long processing times.

Advantageously, techniques herein provide for faster growth rates, higher throughput, broader available chemistries, and lower processing costs than ALD or CVD. Thicker films are achievable compared to ALD, and better conformality is achieved compared to CVD. Accordingly, films using methods discussed herein can be formed quickly, economically, and more consistently conformal.

One embodiment is directed to a method of processing a substrate, the method comprising: providing a substrate; depositing a first film of a self-assembled monolayer (SAM) over the substrate, the first film of the SAM including an acid generator configured to generate acid in response to a predetermined stimulus; depositing a first film of a polymer over the first film of the SAM, the first film of the polymer being soluble to a predetermined developer and configured to change solubility in response to exposure to the acid; stimulating the acid generator; diffusing the acid from the acid generator into the first film of the polymer; and developing the first film of the polymer with the predetermined developer to remove portions of the first film of the polymer that are not protected from the predetermined developer. This can include determining a first pattern of stimulus exposure in which the first pattern of stimulus exposure has a spatially variable exposure intensity across a surface of the substrate, and the acid generator is stimulated based on the first pattern of stimulus exposure.

One embodiment is directed to a method of processing a substrate, the method comprising: providing a substrate; depositing a first film of a self-assembled monolayer (SAM) over the substrate, a structure of the SAM including a head group, a tail, and a functional group, the tail connecting the head group to the functional group, the head group attaching to a surface of the substrate, the functional group including an amine functional group; depositing a first film of a dianhydride on the first film of the SAM, the first film of the dianhydride including dianhydride molecules; reacting the amine functional group with anhydride ends of the dianhydride molecules to form imide bonds; and removing remaining dianhydride molecules from the substrate that did not react with the amine functional group.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of processing a substrate, the method comprising:
   providing a substrate;
   depositing a first film of a self-assembled monolayer (SAM) over the substrate, the first film of the SAM including an acid generator configured to generate acid in response to a predetermined stimulus;
   depositing a first film of a polymer over the first film of the SAM, the first film of the polymer being soluble to a predetermined developer and configured to change solubility in response to exposure to the acid;
   stimulating the acid generator;
   diffusing the acid from the acid generator into the first film of the polymer; and
   developing the first film of the polymer with the predetermined developer to remove portions of the first film of the polymer that are not protected from the predetermined developer.

2. The method of claim 1, further comprising:
   depositing a second film of the SAM over the first film of the polymer, the second film of the SAM including the acid generator configured to generate acid in response to the predetermined stimulus;
   depositing a second film of the polymer over the second film of the SAM, the second film of the polymer being soluble to the predetermined developer and configured to change solubility in response to exposure to the acid;
   stimulating the acid generator;
   diffusing the acid from the acid generator into the second film of the polymer; and
   developing the second film of the polymer with the predetermined developer to remove portions of the second film of the polymer that are not protected from the predetermined developer.

3. The method of claim 2, further comprising:
   repeating at least one iteration of the depositing of a given film of the SAM, depositing of a given film of the polymer, stimulating the acid generator, diffusing the acid, and developing the given film of the polymer with the predetermined developer.

4. The method of claim 3, wherein the repeating is performed until a predetermined thickness of a combined thickness of the SAM films and the polymer films is achieved.

5. The method of claim 1, wherein the acid, when diffused into the polymer, initiates a crosslinking reaction to protect the polymer from the predetermined developer.

6. The method of claim 1, wherein a thickness of the first film of the polymer is based on an acid-diffusion length of the acid into the first film of the polymer.

7. The method of claim 6, wherein the acid-diffusion length of the acid is determined by at least one of a bake time, a bake temperature, and a molecular weight of the acid.

8. The method of claim 7, wherein the acid-diffusion length is determined by the bake temperature and the bake time.

9. The method of claim 1, wherein the substrate includes structures disposed on a surface of the substrate.

10. The method of claim 1, wherein a structure of the SAM includes a head group, a tail, and a functional group, the tail connecting the head group to the functional group, the head group attaching to a surface of the substrate, and the functional group configured to generate the acid in response to the predetermined stimulus.

11. The method of claim 1, wherein the acid generator generates acid in response to heating above a predetermined temperature threshold.

12. The method of claim 1, wherein the acid generator generates acid in response to exposure to radiation having a predetermined wavelength.

13. The method of claim 1, wherein the first film of the SAM is deposited by a spin-on deposition.

14. The method of claim 1, wherein the method is executed in a track-based processing module.

15. The method of claim 1, further comprising:
determining a first pattern of stimulus exposure, the first pattern of stimulus exposure having a spatially variable exposure intensity across a surface of the substrate, wherein
the acid generator is stimulated based on the first pattern of stimulus exposure.

16. The method of claim 15, wherein stimulating the acid generator is based on spatially targeted heating of the SAM performed by a direct-write projection tool.

17. The method of claim 15, wherein stimulating the acid generator is based on spatially targeted irradiation of the SAM with radiation having a predetermined wavelength performed by a direct-write projection tool.

18. The method of claim 17, wherein a range of the predetermined wavelength is 300 nm to 750 nm.

19. A method of processing a substrate, the method comprising:
providing a substrate;
depositing a first film of a self-assembled monolayer (SAM) over the substrate, a structure of the SAM including a head group, a tail, and a functional group, the tail connecting the head group to the functional group, the head group attaching to a surface of the substrate, the functional group including an amine functional group;
depositing a first film of a dianhydride on the first film of the SAM, the first film of the dianhydride including dianhydride molecules;
reacting the amine functional group with anhydride ends of the dianhydride molecules to form imide bonds; and
removing remaining dianhydride molecules from the substrate that did not react with the amine functional group.

20. The method of claim 19, wherein the first film of the SAM is deposited with the functional group being a nitro group and the nitro group is converted to an amine group using radiation prior to depositing the first film of the dianhydride.

* * * * *